US012078668B2

(12) United States Patent
Silliman et al.

(10) Patent No.: US 12,078,668 B2
(45) Date of Patent: Sep. 3, 2024

(54) SELF VALIDATION OF CONTROLLER INTERNAL CIRCUITS

(71) Applicant: CARRIER CORPORATION, Palm Beach Gardens, FL (US)

(72) Inventors: William C. Silliman, Liverpool, NY (US); Gilbert B. Hofsdal, Chittenango, NY (US); Daniel L. Waser, Brewerton, NY (US); Aryn Shapiro, Liverpool, NY (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 626 days.

(21) Appl. No.: 15/734,722

(22) PCT Filed: Sep. 9, 2019

(86) PCT No.: PCT/US2019/050123
§ 371 (c)(1),
(2) Date: Dec. 3, 2020

(87) PCT Pub. No.: WO2020/060782
PCT Pub. Date: Mar. 26, 2020

(65) Prior Publication Data
US 2021/0223302 A1    Jul. 22, 2021

Related U.S. Application Data

(60) Provisional application No. 62/732,290, filed on Sep. 17, 2018.

(51) Int. Cl.
*G01R 31/00*  (2006.01)
*G01R 31/327*  (2006.01)

(52) U.S. Cl.
CPC ....... *G01R 31/005* (2013.01); *G01R 31/3278* (2013.01)

(58) Field of Classification Search
CPC .............. G01R 31/005; G01R 31/3278; B60H 1/00978
See application file for complete search history.

(56) References Cited

U.S. PATENT DOCUMENTS

| 3,829,842 A | 8/1974 | Langdon et al. |
| 5,897,596 A | 4/1999 | Kabune et al. |

(Continued)

FOREIGN PATENT DOCUMENTS

| CN | 101546483 A | 9/2009 |
| JP | 2013192284 A | 9/2013 |
| WO | 20180158602 A1 | 9/2018 |

OTHER PUBLICATIONS

ISL28022 Precision Digital Power Monitor, Intersil, Apr. 26, 2013, available at https://datasheet.octopart.com/ISL28022FUZR5453-Intersil-datasheet-15421056.pdf (Year: 2013).*

(Continued)

*Primary Examiner* — Daniel R Miller
(74) *Attorney, Agent, or Firm* — CANTOR COLBURN LLP

(57) ABSTRACT

Systems and methods for testing circuit operations are provided. Aspects include a circuit comprising a power source, a switching element, and a load. A sensing element is arranged between the switching element and the load and the sensing element is communicatively coupled to a microcontroller, wherein the microcontroller is configured to perform a diagnostic operation for the circuit comprising obtaining, from the sensing element, first sensor data associated with the load responsive to operating the switching element, wherein the first sensor data comprises electrical values associated with the load, obtaining, from the sensing element, second sensor data associated with an output of the switching element, wherein the second sensor data comprises electrical values associated with the output of the (Continued)

switching element, and analyzing the first sensor data and the second sensor data to determine a fault condition for the circuit.

13 Claims, 4 Drawing Sheets

(56) References Cited

U.S. PATENT DOCUMENTS

| | | | |
|---|---|---|---|
| 7,424,657 B2 | 9/2008 | Zettler | |
| 7,443,309 B2 | 10/2008 | Baldwin et al. | |
| 8,090,551 B2 | 1/2012 | Almonte | |
| 8,438,432 B2 | 5/2013 | Gupta et al. | |
| 8,484,524 B2 | 7/2013 | Maddali | |
| 9,007,735 B2 | 4/2015 | Park | |
| 9,058,419 B2 | 6/2015 | Costin et al. | |
| 9,285,424 B2 | 3/2016 | Singh et al. | |
| 9,329,210 B1 | 5/2016 | Gupta et al. | |
| 10,018,673 B2 | 7/2018 | Kurosawa | |
| 10,018,675 B1 | 7/2018 | Titley et al. | |
| 2002/0170299 A1* | 11/2002 | Jayanth | F04C 28/28 62/126 |
| 2003/0060933 A1* | 3/2003 | Sulfstede | G05B 23/0235 700/277 |
| 2004/0027118 A1 | 2/2004 | Lenz et al. | |
| 2005/0196285 A1* | 9/2005 | Jayanth | H02H 3/08 417/410.5 |
| 2006/0214810 A1 | 9/2006 | Alvord | |
| 2010/0293397 A1* | 11/2010 | Pham | F04B 49/065 706/54 |
| 2012/0065919 A1 | 3/2012 | Brown et al. | |
| 2013/0009648 A1 | 1/2013 | Tae | |
| 2014/0327450 A1 | 11/2014 | Schmauss et al. | |
| 2015/0162747 A1 | 6/2015 | Iwasaki | |
| 2017/0276702 A1 | 9/2017 | Freer | |
| 2018/0158602 A1 | 6/2018 | Inoue et al. | |
| 2018/0238968 A1 | 8/2018 | Wada et al. | |
| 2018/0246169 A1 | 8/2018 | Miura et al. | |

OTHER PUBLICATIONS

International Preliminary Report on Patentability; Mailed: Mar. 25, 2021; Application No. PCT/US2019/050123; Filed: Sep. 9, 2019; 9 pages.
International Search Report and Written Opinion; Mailed: Dec. 17, 2019; Application No. PCT/US2019/050123; Filed: Sep. 9, 2019; 15 pages.
Rockwell Automation, "SmartGuard 600 Controllers", Safety Reference Manual, Catolog Nos. 1752-L24BBB, 1752-L24BBBE, Publication 1752-RM001C-EN-P, Apr. 2009, 60 pages.
Japanese Office Action for Application No. 2020570109, Issued Aug. 8, 2023, 3 Pages.

* cited by examiner

SELF VALIDATION OF CONTROLLER INTERNAL CIRCUITS

BACKGROUND

Exemplary embodiments pertain to the art of circuitry diagnostics and more particularly to self-validation of container controller internal circuits.

Transport refrigeration units (TRUs) are containers designed to carry perishable freight at a specific temperature or within a temperature range. TRUs can be equipped with a variety of refrigeration systems for maintaining a specific temperature within the cabin. Typically, a control system operates the refrigeration system to maintain the temperature inside the cabin. These control systems consist of circuit elements that can malfunction over time. In addition, connections between components of the control system can degrade or become disconnected. For example, a load on the control system can lose the mechanical connection with the pins of the control system. Instead of just replacing the control system when there is a malfunction, there exists a need for a testing process for the various locations within the circuitry of the control system to identify the cause of the malfunction.

BRIEF DESCRIPTION

According to one embodiment, a system is provided. The system includes a circuit comprising a power source, a switching element, and a load. A sensing element is arranged between the switching element and the load and the sensing element is communicatively coupled to a microcontroller, wherein the microcontroller is configured to perform a diagnostic operation for the circuit comprising obtaining, from the sensing element, first sensor data associated with the load responsive to operating the switching element, wherein the first sensor data comprises electrical values associated with the load, obtaining, from the sensing element, second sensor data associated with an output of the switching element, wherein the second sensor data comprises electrical values associated with the output of the switching element, and analyzing the first sensor data and the second sensor data to determine a fault condition for the circuit.

In addition to one or more of the features described above, or as an alternative, further embodiments of the system may include that analyzing the first sensor data includes comparing the electrical values associated with the load to an operational range of values for the load.

In addition to one or more of the features described above, or as an alternative, further embodiments of the system may include that analyzing the second sensor data includes comparing the electrical values associated with the output of the switching element to an operational range of values for the output of the switching element.

In addition to one or more of the features described above, or as an alternative, further embodiments of the system may include that the diagnostic operation for the circuit further includes associating the fault condition with the load based on a determination that the electrical values associated with the load are outside the operational range of values for the load and a determination that the electrical values associated with the output of the switching element are inside the operational range of values for the output of the switching element.

In addition to one or more of the features described above, or as an alternative, further embodiments of the system may include that the sensing element is a first sensing element; and wherein the system further includes a second sensing element arranged between the power source and the switching element, the second sensing element communicatively coupled to the microcontroller, wherein the diagnostic operation for the circuit further includes obtaining, from the second sensing element, third sensor data associated with the power source, wherein the third sensor data comprises electrical values associated with the power source and comparing the electrical values associated with the power source to an operation range of values for the power source.

In addition to one or more of the features described above, or as an alternative, further embodiments of the system may include that the diagnostic operation for the circuit further includes associating the fault condition with the switching element based on a determination that the electrical values associated with the output of the switching element are outside the operational range of values for the output of the switching element and a determination that the electrical values associated with the power source are inside the operational range of values for the power source.

In addition to one or more of the features described above, or as an alternative, further embodiments of the system may include that the diagnostic operation for the circuit further includes associating the fault condition with the power source based on a determination that the electrical values associated with the power source are outside the operational range of values for the power source.

In addition to one or more of the features described above, or as an alternative, further embodiments of the system may include that the diagnostic operation for the circuit further includes generating an alert based on the fault condition and displaying, on a display device, the alert.

In addition to one or more of the features described above, or as an alternative, further embodiments of the system may include that the sensing element comprises a voltage sensing circuit.

In addition to one or more of the features described above, or as an alternative, further embodiments of the system may include that the sensing element comprises a current sensing circuit.

In addition to one or more of the features described above, or as an alternative, further embodiments of the system may include that the sensing element comprises a feedback resistor coupled to the output of the switching element.

In addition to one or more of the features described above, or as an alternative, further embodiments of the system may include an analog to digital converter communicatively coupled to the microcontroller.

In addition to one or more of the features described above, or as an alternative, further embodiments of the system may include that the circuit is a control system for a trailer refrigeration unit.

According to one embodiment, a method is provided. The method includes obtaining, by a processor from a sensing element in a circuit, first sensor data associated with a load on the circuit, wherein the circuit comprises a power source and a switching element, wherein the first sensor data is obtained responsive to operation of the switching element, wherein the first sensor data comprises electrical values associated with the load, obtaining, from the sensing element, second sensor data associated with an output of the switching element, wherein the second sensor data comprises electrical values associated with the output of the switching element and analyzing the first sensor data and the second sensor data to determine a fault condition for the circuit.

In addition to one or more of the features described above, or as an alternative, further embodiments of the method may include that analyzing the first sensor data includes comparing the electrical values associated with the load to an operational range of values for the load and analyzing the second sensor data includes comparing the electrical values associated with the output of the switching element to an operational range of values for the output of the switching element.

In addition to one or more of the features described above, or as an alternative, further embodiments of the method may include associating the fault condition with the load based on a determination that the electrical values associated with the load are outside the operational range of values for the load, and a determination that the electrical values associated with the output of the switching element are inside the operational range of values for the output of the switching element.

In addition to one or more of the features described above, or as an alternative, further embodiments of the method may include that obtaining, from a second sensing element in the circuit, third sensor data associated with the power source, wherein the third sensor data comprises electrical values associated with the power source and comparing the electrical values associated with the power source to an operation range of values for the power source.

In addition to one or more of the features described above, or as an alternative, further embodiments of the method may include that associating the fault condition with the switching element based on a determination that the electrical values associated with the output of the switching element are outside the operational range of values for the output of the switching element and a determination that the electrical values associated with the power source are inside the operational range of values for the power source.

In addition to one or more of the features described above, or as an alternative, further embodiments of the method may include associating the fault condition with the power source based on a determination that the electrical values associated with the power source are outside the operational range of values for the power source.

In addition to one or more of the features described above, or as an alternative, further embodiments of the method may include generating an alert based on the fault condition and displaying, on a display device, the alert.

BRIEF DESCRIPTION OF THE DRAWINGS

The following descriptions should not be considered limiting in any way. With reference to the accompanying drawings, like elements are numbered alike.

DETAILED DESCRIPTION

Turning now to an overview of technologies that are more specifically relevant to aspects of the disclosure, transport refrigeration units (TRUs) are containers designed to carry perishable freight at a specific temperature or within a temperature range. Refrigerated cargo trucks or refrigerated tractor trailers, such as those utilized to transport cargo via sea, rail, or road, is a truck, trailer or cargo container, generally defining a cargo compartment, and modified to include a refrigeration system located at one end of the truck, trailer, or cargo container. Refrigeration systems typically include a compressor, a condenser, an expansion valve, and an evaporator serially connected by refrigerant lines in a closed refrigerant circuit in accord with known refrigerant vapor compression cycles. A power unit, such as a combustion engine, drives the compressor of the refrigeration unit, and may be diesel powered, natural gas powered, or other type of engine. TRUs can be equipped with a variety of refrigeration systems for maintaining a specific temperature within the cabin. Typically, an onboard controller circuit manages the operation of the refrigeration system. Over time, the onboard controller circuit requires maintenance and/or testing. To check functional operations of the controller's output, the output state is manually monitored by a trained service person who would activate the output and monitor the load status and output operation with a voltage or current meter testing at various test points. These service test points allow service technicians to troubleshoot system failures for the controller circuits. As the controller typically has multiple outputs, this manual testing can be complex. For example, current refrigeration controllers have 29 outputs. To meet cost and space constraints on these controller circuits, these service test points can be removed.

Turning now to an overview of the aspects of the disclosure, one or more embodiments of the disclosure address the above-described issues by providing systems and methods for allowing a controller to perform self-validation utilizing internal current and voltage sensing inputs. The controller can perform self-validation utilizing three internal sensors that monitor the controller outputs. The controller outputs can include a mixture of loads on the controller such as, for example, a 24 V A/C load and a 12V D/C load. Internal voltage feedback from power source inputs and each output being monitored can be compared to the expected voltage change at output due to output change of state. Internal current sensors reading of measured current draw can be compared against expected current draws for 12 VDC and 24 VAC loads. Monitoring of output voltage and current draw allows for a self-diagnostic of correct output operation to be performed on the controller.

Figure 1:
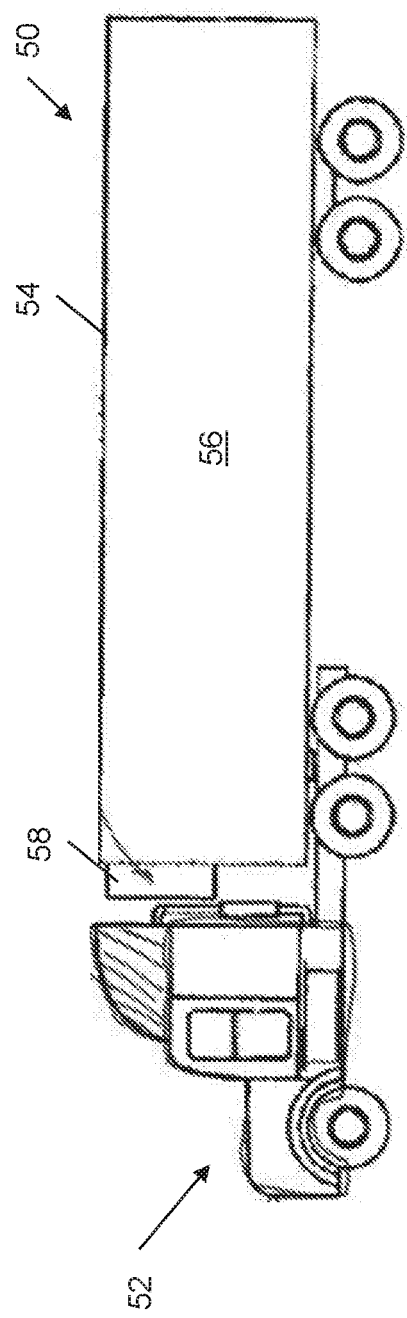
FIG. 1 depicts a transport refrigeration unit in an exemplary embodiment.

As mentioned above, the controller (or control system) is utilized in TRUs. FIG. 1 depicts an exemplary transport refrigeration system 50 having a refrigerated trailer. The trailer may be pulled by a tractor 52. The exemplary trailer includes a container 54 defining an interior compartment 56. It is understood that embodiments described herein may be applied to shipping containers that are shipped by rail or sea, without use of a tractor 52. An equipment housing 58 mounted to a front of the container 54 may contain a power supply. A refrigeration system may be electrically coupled to the power supply to receive electrical power. Refrigeration system includes a compressor, condenser, expansion valve and one or more evaporators defining a refrigeration circuit for circulating a refrigerant, as known in the art. Refrigeration system also includes one or more fans, such as a condenser fan, evaporator fan or ventilation fan. It is understood that embodiments described herein may be applied to shipping containers that are shipped by rail, sea, air, or any other suitable container, thus the vehicle may be a truck, train, boat, airplane, etc.

Figure 2:
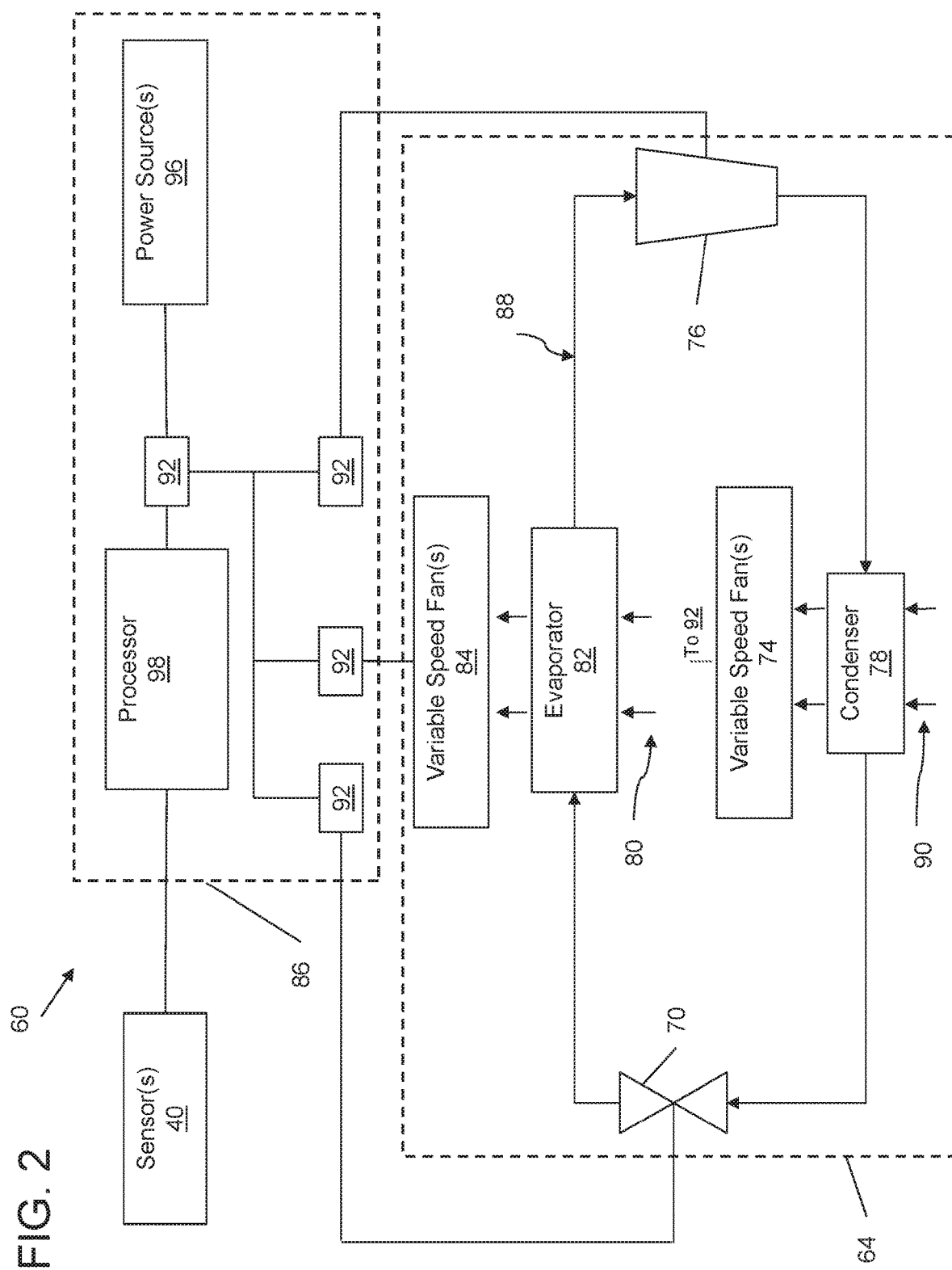
FIG. 2 depicts a diagrammatic illustration of an embodiment of a refrigeration unit.

A diagrammatic illustration of an embodiment of a refrigeration system 60 is shown in FIG. 2. The refrigeration system 60 includes a power source 96, a refrigeration unit 64 configured with a compressor 76, a condenser 78, a refrigerant regulator 70, an evaporator 82, at fans 74, 84, and a control system 86 ("controller"). The refrigeration unit 64 is configured such that refrigerant travels through the compressor 76, the condenser 78, the refrigerant regulator 70 and the evaporator 82 in a closed loop path 88. The fan 84 has an alternating current ("ac") motor or a direct current ("dc") motor and is configured to condition air 80 from the interior compartment 56 in FIG. 1, and/or in some embodiments from outside the interior compartment 56 in FIG. 1, through the evaporator 82, and back into the interior compartment 56 in FIG. 1. The fan 74 has an alternating current ("ac") motor or a direct current ("dc") motor and is configured to move outside air 90, through the condenser 78, in order to reject heat out of the refrigeration system. The power source 96 is adapted to supply power to one or more of the components of the refrigeration unit 64 (e.g. the compressor 76, the refrigerant regulator 70, the fan 84, the fan 74, the controller 98, etc.).

The controller circuit 86 includes a processor 98 that is adapted to receive one or more feedback signals from one or more sensors 40, positioned within the interior compartment and/or the refrigeration unit 64, indicative of an environmental parameter (e.g., temperature, pressure, humidity, etc.) within the interior compartment, and/or feedback signals indicative of operating parameters of the refrigeration unit 64. The processor 98 is further adapted to selectively maintain or change the operating mode of the refrigeration unit 64, using actuators 92 (e.g., switches, valves, relays, triacs, FETs, transistors, and other power switching device) in communication with the refrigeration unit 64 based on the feedback signals, an algorithm, or some combination thereof. For example, a temperature value sensed within the interior compartment may prompt the controller 86 to engage a non-operating refrigeration unit 64 to supply cooling air to the interior compartment, or it may prompt the controller 86 to disengage an operating refrigeration unit 64. Similarly, an operating parameter value associated with the refrigeration unit 64 may prompt the controller 86 to engage a dormant refrigeration unit 64, or to disengage an operating refrigeration unit 64. It should be noted that the functionality of the processor 98 may be implemented using hardware, software, firmware, or a combination thereof.

Figure 3:
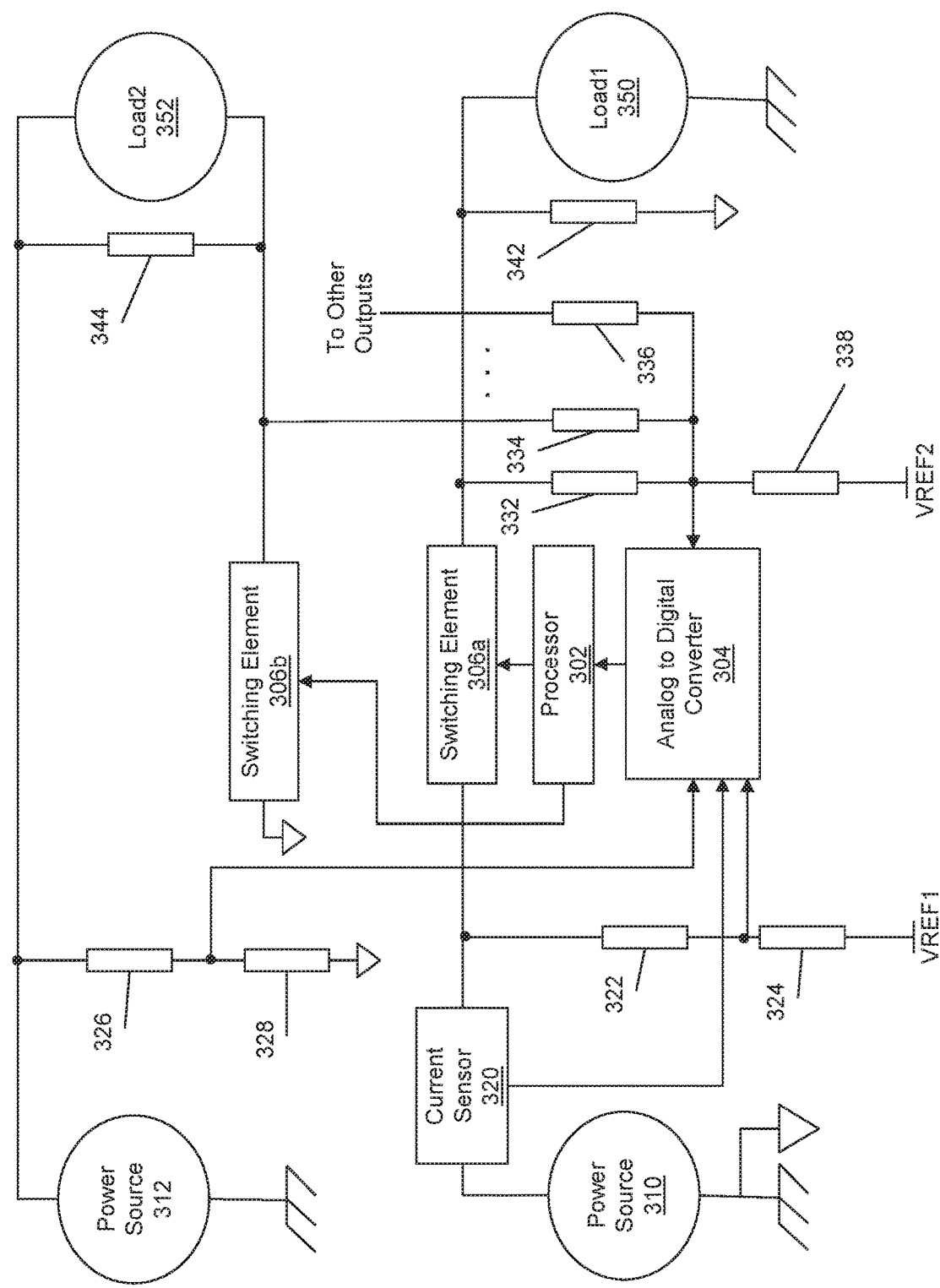
FIG. 3 depicts a block diagram of a control system with self-validation utilizing internal circuits according to one or more embodiments.

FIG. 3 depicts a block diagram of a control system with self-validation utilizing internal circuits according to one or more embodiments. The control system 300 includes a processor 302 and an analog to digital converter (ADC) 304. The microcontroller 302 is configured to operate one or more power switches 306a, 306b. The control system 200 includes one or more power sources 310, 312 and one or more loads 350, 352. The loads 350, 352, for example, can be any of the elements in the refrigeration unit 64 of FIG. 2. The power sources 310, 312 can be an alternating current (AC) power source or a direct current (DC) power source. The power sources 310, 312 can be connected to the switching elements 306a, 306b connected to the power source 310 (High Side Power Switching Element) or Ground (Low Side Power Switching Element). In one or more embodiments, the control system 300 can be the controller 86 for a refrigeration unit 64 as described in FIG. 2.

In one or more embodiments, the power input from the power sources 310, 312 can be monitored by the ADC 304 so that the processor 302 can detect the presence or availability of the load power. A resister 322 and resistor 324 can monitor power source 310 and resister 326 and resistor 328 can monitor power source 312 using inputs into the ADC 304. The output of the ADC 304 can go through a multiplexer (MUX) before being routed to the processor 302. The processor 302 can analyze the ADC 304 outputs to determine if the monitored voltage or current are within a normal operating range for the circuit to determine if there is a potential issue with the control system 300. In one or more embodiments, a reference voltage (VREF1) can provide a DC offset for an AC power signal to ensure the full AC signal can be read by the ADC 304. A current sensor 320 is utilized to monitor the load current going to power outputs. The current sensor 320 can be an AC or DC current sensor.

In one or more embodiments, the switching elements 306a, 306b are controlled by the processor 302 which can control each element individually or in concert as needed for both normal operation of the control system 300 or during a diagnostic test of the system. The output of the first switching element 306a can be fed back through a first feedback resistor 332 which is connected to the ADC 304 through an input channel. The output of the second switching element 306b can be fed back through the second feedback resistor 334 which is connected to the ADC 304. For any other switching elements, additional feedback resistors 336 can be utilized. In one or more embodiments, a summing junction may be offset by a reference voltage (VREF2) to allow an AC signal to be monitored without clipping. The switching element 306a, 306b outputs may have a pull up resistor 334 or a pull down resistor 342 to ensure the analog signal from the switching element 306a, 306b in the OFF state follows an expected state by avoiding a floating output or an error due to potential leakage current. In one or more embodiments, the feedback resistors 332, 334, 336 can be much larger than the loads 350, 352 so that the feedback does not add any significant loading to the switching elements 306a, 306b. Also, the feedback resistors 332, 334, 336 resistance ratio to the common voltage feedback node (e.g., summing resistor) 338 can be optimized for either resolution or range. The common voltage feedback node 338 for all outputs is utilized to sense the change in voltage representative of a change in output state of one or more outputs. The benefit of a single voltage feedback node 338 for all outputs is a reduction is size and complexity allowing monitoring of all outputs with a minimum number of components and ADC resources (1 ADC channel).

In one or more embodiments, processor 302 can be utilized to perform a diagnostic operation to identify fault conditions within the circuitry of the system 300. This is performed by monitoring voltage and current values using the ADC 304. The diagnostic operation can be initiated automatically if a problem with the control system 300 is detected removing the need for a technician to manually troubleshoot. During the diagnostic operation, the processor 302 can access from a memory known operational ranges of values for the different loads 350, 352 and power sources 310, 312. For example, a nominal current draw of each load 350, 352 can be stored in a memory accessed by the processor 302.

In one or more embodiments, the processor 302 can verify that a power supply is present and within operating range of values by reading a corresponding ADC 304 channel monitoring the power source 310, 312. The processor 302 can operate the switching elements 306a, 306b to turn ON one or more of the output loads 350, 352. The processor 302 can verify the change in load current and/or load voltage and compare these values to the operational range for the specific load. If the change in load current and/or load voltage is not an expected value, the processor 302 can then verify if the switching element is changing state or not. If the switching element 306a, 306b is operating within the expected range of values and the load current/voltage is not within the expected range of values, the load 350 is likely the cause of an issue with the control system 300. Some example load issues include wires or pins are not properly connected from the controller to the load or there is a malfunctioning component of the load (e.g., a bad compressor in a refrigeration unit, etc.) If the load current/voltage values are within the expected range of values but there is not voltage at the output of the switching element 306a, 306b, then the switching element may be the cause of an issue with the system 300. However, to confirm the switching element is the likely cause of the issue, the processor 302 monitors the power source to determine if the power source 310, 312 has a voltage value within an expected range of values for the power source. If the power source 310, 312 has voltage values within expected range and the load has voltage/current values within expect range, then the switching element 306a, 306b is the cause of the issue and would need to be replaced. For example, the control system typically controls refrigeration system loads through the use of contactors which are rated for higher current and/or voltage that the smaller power switching devices on the refrigeration control board. For example in a container system, the control system will turn on a 24 VAC output (triac/relay) that in turn will energize a high voltage contactor which connects 460 VAC power to the compressor. Embodiments reference the diagnostic in the control system which will measure the 24 VAC voltage/current applied from the internal relay/triac to the high voltage contactor coil, but the 460 VAC voltage or current that goes through the contactor contacts is not monitored directly. There are separate optional external voltage and current step-down transformers that may be used to monitor the primary voltage and current signals. One or more embodiments herein, pertain to monitoring the operation of the control system's internal power control devices not external power devices.

In one or more embodiments, the processor 302 can generate an alert based on monitoring the voltage/current values for the power source, switching element, and load. This alert can be displayed on a display device connected to the system 300 and accessed by a technician. In some embodiments, the alert can be transmitted via a network to a device for display to a user.

Figure 4:
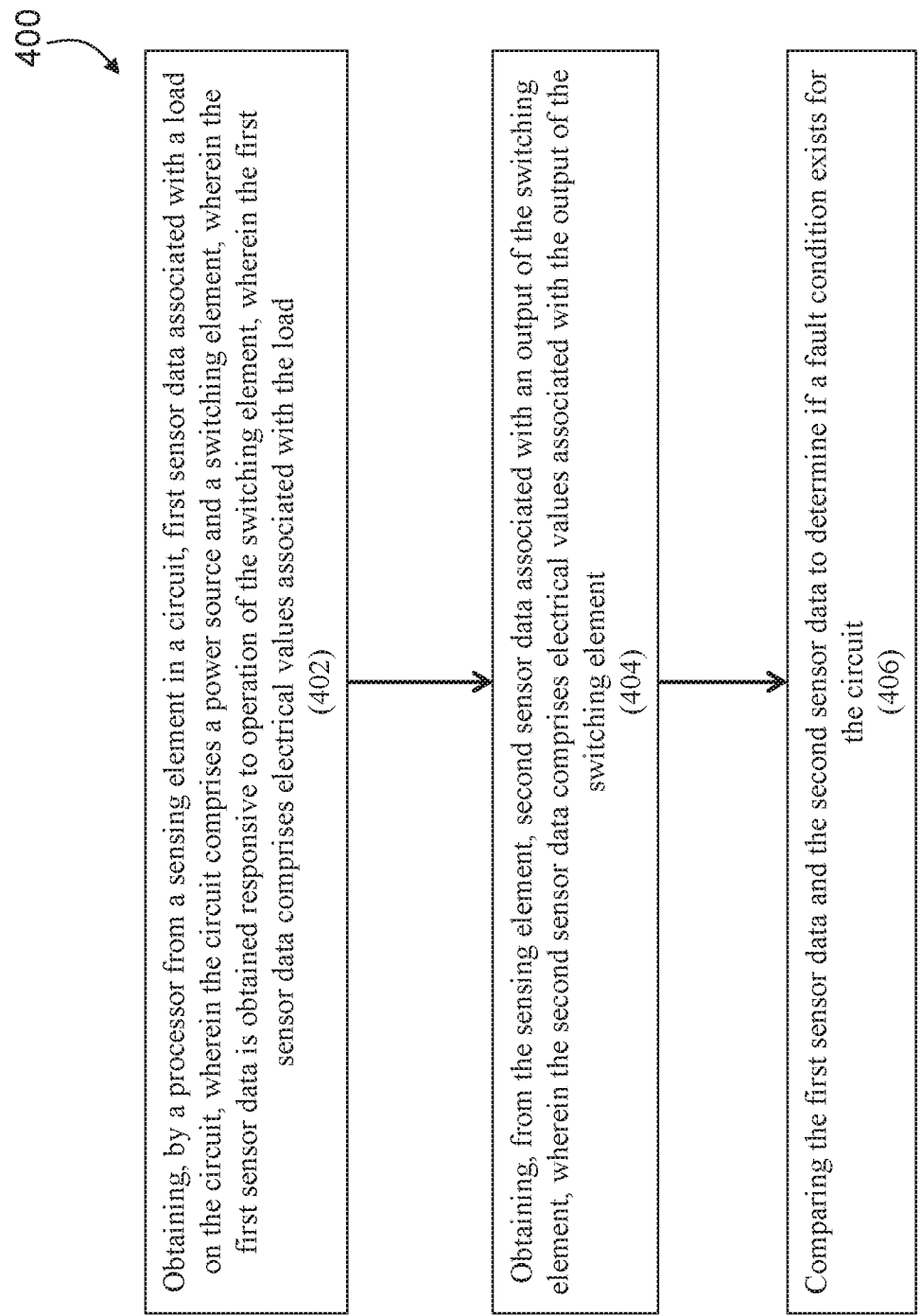
FIG. 4 depicts a flow diagram of a method for testing circuit operation according to one or more embodiments.

FIG. 4 depicts a flow diagram of a method for testing circuit operation according to one or more embodiments. The method 400 includes obtaining, by a processor from a sensing element in a circuit, first sensor data associated with a load on the circuit, wherein the circuit comprises a power source and a switching element, wherein the first sensor data is obtained responsive to operation of the switching element, wherein the first sensor data comprises electrical values associated with the load, as shown in block 402. The method 400, at block 404, includes obtaining, from the sensing element, second sensor data associated with an output of the switching element, wherein the second sensor data comprises electrical values associated with the output of the switching element. And at block 406, the method 400 includes comparing the first sensor data and the second sensor data to determine if a fault condition exists for the circuit.

Additional processes may also be included. It should be understood that the processes depicted in FIG. 4 represent illustrations and that other processes may be added or existing processes may be removed, modified, or rearranged without departing from the scope and spirit of the present disclosure.

A detailed description of one or more embodiments of the disclosed apparatus are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for testing circuit operation, the system comprising:
  a circuit comprising a power source, a switching element, and a load;
  a processor;
  an analog to digital converter configured to receive electrical values from a first node between the switching element and the load, the analog to digital convertor communicatively coupled to the processor, wherein the processor is configured to perform a diagnostic operation for the circuit comprising:
  obtaining, from the analog to digital converter, first data associated with the load responsive to operating the switching element to turn ON, wherein the first data comprises electrical values from a second node, wherein the second node is between a first resistor connected to the first node and a second resistor connected to a reference voltage;
  obtaining, from the analog to digital convertor, second data associated with an output of the switching element, wherein the second data comprises electrical values obtained at the output of the switching element; and
  analyzing the first data and the second data to determine a fault condition for the circuit;
  wherein analyzing the first data comprises comparing the electrical values from the second node to an operational range of values for the load;
  wherein analyzing the second data comprises comparing the electrical values obtained at the output of the switching element to an operational range of values for the output of the switching element;

wherein the diagnostic operation for the circuit further comprises:
associating the fault condition with the load based on:
a determination that the electrical values from the second node are outside the operational range of values for the load; and
a determination that the electrical values obtained at the output of the switching element are inside the operational range of values for the output of the switching element.

2. The system of claim 1, wherein the system further comprises:
a sensing element arranged between the power source and the switching element, the sensing element communicatively coupled to the analog to digital convertor, wherein the diagnostic operation for the circuit further comprises:
obtaining, from the sensing element, sensor data associated with the power source, wherein the sensor data comprises electrical values associated with the power source; and
comparing the electrical values associated with the power source to an operation range of values for the power source.

3. The system of claim 2, wherein the diagnostic operation for the circuit further comprises:
associating the fault condition with the switching element based on:
a determination that the electrical values associated with the output of the switching element are outside the operational range of values for the output of the switching element; and
a determination that the electrical values associated with the power source are inside the operational range of values for the power source.

4. The system of claim 2, wherein the diagnostic operation for the circuit further comprises:
associating the fault condition with the power source based on a determination that the electrical values associated with the power source are outside the operational range of values for the power source.

5. The system of claim 1, wherein the diagnostic operation for the circuit further comprises:
generating an alert based on the fault condition; and
displaying, on a display device, the alert.

6. The system of claim 1, wherein the sensing element comprises a voltage sensing circuit.

7. The system of claim 2, wherein the sensing element comprises a current sensing circuit.

8. The system of claim 1, wherein the circuit is a control system for a trailer refrigeration unit.

9. A method for testing circuit operation, the method comprising:
obtaining, by a processor from an analog to digital convertor in a circuit, first data associated with a load on the circuit, wherein the circuit comprises a power source and a switching element, and the analog to digital convertor is configured to receive electrical signals from a first node between the switching element and the load;
wherein the first data is obtained responsive to operation of the switching element to turn ON;
wherein the first data comprises electrical values from a second node, wherein the second node is between a first resistor connected to the first node and second resistor connected to a reference voltage;
obtaining, from the analog to digital convertor, second data associated with an output of the switching element, wherein the second data comprises electrical values obtained at the output of the switching element; and
analyzing the first data and the second data to determine a fault condition for the circuit;
wherein analyzing the first data comprises comparing the electrical values from the second node to an operational range of values for the load; and
wherein analyzing the second data comprises comparing the electrical values obtained at the output of the switching element to an operational range of values for the output of the switching element;
associating the fault condition with the load based on:
a determination that the electrical values from the second node are outside the operational range of values for the load; and
a determination that the electrical values obtained at the output of the switching element are inside the operational range of values for the output of the switching element.

10. The method of claim 9 further comprising:
obtaining, from a sensing element in the circuit, sensor data associated with the power source, wherein the sensor data comprises electrical values associated with the power source; and
comparing the electrical values associated with the power source to an operation range of values for the power source.

11. The method of claim 10 further comprising:
associating the fault condition with the switching element based on:
a determination that the electrical values obtained at the output of the switching element are outside the operational range of values for the output of the switching element; and
a determination that the electrical values associated with the power source are inside the operational range of values for the power source.

12. The method of claim 10 further comprising:
associating the fault condition with the power source based on a determination that the electrical values associated with the power source are outside the operational range of values for the power source.

13. The method of claim 9 further comprising:
generating an alert based on the fault condition; and
displaying, on a display device, the alert.

* * * * *